United States Patent
Ta (10) Patent No.: US 10,353,058 B2
(45) Date of Patent: Jul. 16, 2019

(54) SIGNAL PROCESSING UNIT AND METHOD FOR TIME OF FLIGHT MEASUREMENT

(71) Applicant: OSRAM Opto Semiconductors GmbH, Regensburg (DE)

(72) Inventor: Paul Ta, Fremont, CA (US)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/727,376

(22) Filed: Oct. 6, 2017

(65) Prior Publication Data

US 2019/0107608 A1    Apr. 11, 2019

(51) Int. Cl.
  *G01S 7/486* (2006.01)
  *H04B 10/61* (2013.01)
  *H03M 3/00* (2006.01)
  *H03M 1/00* (2006.01)

(52) U.S. Cl.
  CPC ............ *G01S 7/4865* (2013.01); *H04B 10/61* (2013.01); *H03M 1/001* (2013.01); *H03M 3/30* (2013.01)

(58) Field of Classification Search
  CPC .......... G01S 17/36; G01S 17/89; G01S 17/10; G01S 17/42; G01S 17/66; G01S 7/4914; G01S 7/497
  USPC ........................................ 375/147
  See application file for complete search history.

(56) References Cited

U.S. PATENT DOCUMENTS

| 2012/0039366 A1* | 2/2012 | Wood ........................ G01S 7/03 375/219 |
| 2016/0086318 A1* | 3/2016 | Hannuksela ............ G06T 5/002 348/43 |
| 2017/0082724 A1* | 3/2017 | Brousard .............. G01S 5/0252 |

OTHER PUBLICATIONS

Intersil Datasheet, A Renesas Company, ISL29501, Time of Flight (ToF) Signal Processing IC, Rev.5.00, May 5, 2017, pp. 1-22 https://www.intersil.com/content/dam/Intersil/documents/isl2/isl29501.pdf.
Lange, R., et al., "Time-of-flight range imaging with a custom solid-state image sensor," Laser Metrology and Inspection, Proc. SPIE, vol. 3823, Sep. 1999, pp. 1-12.
Pilato, L., et al., "Real-Time and High-Accuracy Arctangent Computation Using CORDIC and Fast Magnitude Estimation," Electronics, 6, 22, Mar. 16, 2017, pp. 1-10.

* cited by examiner

*Primary Examiner* — Leila Malek
(74) *Attorney, Agent, or Firm* — Slater Matsil, LLP (57) ABSTRACT

A signal processing unit for time of flight measurement includes an oscillation module, a transmission module, a detection module, a multiplier, an analog-to-digital-converter and a processing module. The oscillation module provides m reference phases. The transmission module generates a set of light impulses based on a selection phase selected out of the m reference phases. The detection module receives a set of reflections of the set of light impulses and to generate a detector signal based on the set of reflections. The multiplier obtains a result of a multiplication of the detector signal by a comparison phase. The analog-to-digital-converter converts the result of the multiplier into a digital signal. The processing module determines the comparison phase or the selection phase and calculates an approximate phase difference between the set of generated (Continued)

light impulses and the set of received reflections based on the digital signal.

14 Claims, 6 Drawing Sheets

SIGNAL PROCESSING UNIT AND METHOD FOR TIME OF FLIGHT MEASUREMENT

TECHNICAL FIELD

The present invention generally relates to a signal processing unit and a method for time of flight measurement.

BACKGROUND

In accordance with the prior art, distance to a certain object may be measured using triangulation, interferometry, confocal chromatic, direct pulse type time of flight (ToF) or indirect phase type frequency modulation ToF. Indirect phase type frequency modulation ToF usually involves multiplying a detector signal with four separate reference phases. The distance may then be determined as $$D = \frac{c \cdot \text{phase}}{4\pi f},$$

where c denotes the speed of light and f denotes the modulation frequency. The phase may be determined from the four digitally converted products $a_0 \ldots a_3$ as $$\text{phase} = \tan^{-1}\left\{\frac{a_0 - a_1}{a_2 - a_3}\right\}.$$

Consequently, four multipliers and ADC channels are required for computing the phase, which results in a relatively large digital area and high power consumption in a device for time of flight measurement.

SUMMARY

Embodiments of the present invention specify a device and a corresponding method for time of flight measurement that allow for smaller die sizes and contributes to a reduced power consumption.

According to a first aspect of the present invention, a signal processing unit for time of flight measurement is specified.

According to an embodiment with reference to the first aspect, the signal processing unit comprises an oscillation module adapted to provide m reference phases. In this context, the oscillation module may comprise an oscillator, e.g., a crystal oscillator, an internal RC relaxation oscillator or a similar entity that allows for generation of a reference signal with predetermined frequency and phase. Such reference signal may be sinusoidal or non-sinusoidal such as a square wave signal. A frequency of the reference signal may range between 1-20 MHz.

The oscillation module may further comprise a Phase Locked Loop (PLL) or Delay (Line) Locked Loop (DLL) to generate m−1 further reference signals based on the reference signal generated by the oscillator. In total, m reference signals may be generated which differ from each other in their phase offset, particularly with respect to the reference signal generated by the oscillator. Here and in the following, reference signals with differing phase offset are also referred to as "reference phases".

According to an embodiment with reference to the first aspect, the signal processing unit comprises a transmission module adapted to generate at least one set of light impulses (also referred to as light pulses). The transmission module may comprise a light source such as a emitting diode (LED) or a vertical-cavity surface emitting laser (VCSEL) for generating pulsed light. Each light impulse may correspond to a respective impulse of a driver signal for driving the transmission module. Specifically, the transmission module may be adapted to generate a set of light impulses based on a respective selection phase selected out of the m reference phases. In this context, the transmission module may further comprise a LED/VCSEL driver unit for providing a driving current based on the selection phase.

The transmission module may be configured to operate in a (periodic) pulse mode in which light impulses are generated only in a comparably short time interval, while the transmission module is in a disabled operational state for the remaining time (of each cycle). Specifically, light impulses may be generated in only 0.5% to 5% of the transmission module's operational time or of each cycle, respectively. Preferably, light impulses are generated in only up to 1% of the transmission module's operational time or of each cycle, respectively.

Alternatively, the transmission module may be configured to operate in a continuous mode.

Here and in the following, a light pulse refers to a series or set of light impulses corresponding to the driver signal of the transmission module.

According to an embodiment with reference to the first aspect, the signal processing unit comprises a detection module adapted to receive a set of light impulses and to generate a detector signal based on the set of light impulses. Specifically, the light impulses received by the detection module may be reflections of the light impulses generated by the transmission module. In other words, the detection module may be adapted to receive a respective set of reflections of each set of one or more sets of light impulses and to generate a detector signal based on the set of reflections. Impulses of the detector signal may correspond to the impulses of the received reflections. The detection module may comprise a photo diode or the like in order to generate the electrical detector signal.

According to another embodiment with reference to the first aspect, the signal processing unit comprises a multiplier. Specifically, the multiplier may be adapted to multiply the detector signal by a respective comparison phase. The multiplier may particularly be an analog multiplier configured to take the detector signal and the respective comparison phase as two analog input signals and to produce an output which is their product. The output of the multiplier may be an analog signal, in the following referred to as "the result" of the multiplier. The signal processing unit may comprise exactly one such multiplier or exactly four such multipliers.

According to another embodiment with reference to the first aspect, the signal processing unit comprises an analog-to-digital-converter (ADC). Specifically, the ADC may be adapted to convert the result of the multiplier into a digital signal. The ADC may be, for example, configured as an incremental ADC. Particularly, the ADC may be configured as a delta-sigma or ADC successive-approximation ADC or a combination thereof. The signal processing unit may particularly comprise exactly one ADC-channel, i.e., exactly one analog signal is converted by the ADC into a digital signal.

According to another embodiment with reference to the first aspect, the signal processing unit comprises a processing module. Specifically, the processing module may be adapted to determine the respective comparison phase or the respective selection phase and to calculate an approximate phase difference between the set of generated light impulses and the set of received reflections based on the digital signal. The processing module may comprise a digital filter or a digital signal processor (DSP), a microcontroller unit (MCU), or the like.

The phase difference may be computed by determining the reference phase in quadrature with the detector signal, i.e., by determining either the comparison phase or selection phase that causes the result of the multiplier to approach zero. In particular, the signal processing unit may be adapted to pick one of the m reference phases as the comparison phase and one of the m reference phases as the selection phase. Either the comparison phase or the selection phase may subsequently be run through the m reference phases until the result of the multiplier approaches zero, while the other one of the selection phase and the comparison phase, respectively, remains fixed. In other words, a phase controller for distance measurement can be applied in the transmit path or receive signal path. The fixed one of the selection phase and the comparison phase may be predetermined, e.g., the first of the m reference phases.

According to another embodiment with reference to the first aspect, the signal processing unit comprises an oscillation module, a transmission module, a detection module, one or more multipliers, an ADC and a processing module. The oscillation module is adapted to provide m reference phases. The transmission module is adapted to generate one or more sets of light impulses based on a respective selection phase selected out of the m reference phases. The detection module is adapted to receive a respective set of reflections of the set of light impulses and to generate a detector signal based on each set of reflections. The multiplier (or each multiplier) is adapted to multiply the detector signal by a respective comparison phase. The ADC is adapted to convert the result of the multiplier into a digital signal. The processing module is adapted to determine the respective comparison phase or the respective selection phase and to calculate an approximate phase difference between the set of generated light impulses and the set of received reflections based on the digital signal.

Since a comparison phase or a selection phase is determined by the processing module, multiplication of the detector signal by the m reference phases can be accomplished solely with one multiplier and ADC. Consequently, a digital area of the signal processing unit as well as its power consumption may be reduced.

Specifically, with the signal processing unit according to some embodiments, the phase difference is not required to be calculated in the digital domain, thereby allowing for smaller die sizes and low manufacturing costs compared to the prior art.

Furthermore, due to the minimized power consumption particularly in the digital section of the signal processing unit, drone, portable, mobile applications of the signal processing unit are enabled. Additionally, the number of transmitted cycles in case the signal to noise ratio (SNR) is dominated by quantization noise may be reduced.

Moreover, an architecture of the signal processing unit may be scalable for performance, i.e., dynamic range or resolution, power and cost trade off. Specifically, the signal processing unit may be reconfigurable for low precision applications such as present detect, zone detect or proximity detect; the signal processing unit may also be reconfigurable for high precision applications that require 1 cm resolution over 2 m range.

According to another embodiment with reference to the first aspect, the ADC is a delta-sigma converter.

According to another embodiment with reference to the first aspect, the oscillation module is coupled with the transmission module to provide the selection phase. The oscillation module is further coupled with the multiplier to provide the comparison phase. Moreover, the detection module is connected to the multiplier to provide the detector signal. The multiplier is connected to the ADC to provide the result to be converted. Furthermore, the ADC is connected to the processing module to provide the digital signal, and the processing module is connected to the oscillation module to provide a control signal for selecting the comparison phase or the selection phase.

Specifically, the processing module may be adapted to provide a control signal for selecting either of the comparison phase or the selection phase among the m reference phases, whereas a predetermined, fixed phase among the m reference phases, such as the first reference phase, may be used—independent of the control signal—as the selection phase or the comparison phase, respectively. Alternatively, the control signal may be used to select both the comparison phase and the selection phase among the m reference phases.

According to an embodiment with reference to the first aspect, the oscillation module comprises a clock generator adapted to generate the m reference phases and a phase selector adapted to pick two phases out of the m reference phases. The processing module is adapted to control the phase selector based on the digital signal, and the comparison phase or the selection phase is selected among the two phases based on the result of the multiplier.

Particularly, the processing module may be adapted to provide a control signal used to pick two known reference phases out of the m reference phases. In this regard, the processing module may include one or more digital filters that can be used to select the two phases. The output of the ADC may be fed back to the multiplier unprocessed in order to allow for a selection between either of the two phases as a comparison phase being multiplied by the detector signal. Alternatively, the output of the ADC may be forwarded unprocessed to the transmission module to allow for a selection between either of the two phases as a selection phase.

The signal processing unit may specifically be configured to interpolate the arrival time between the picked two known reference phases. Advantageously, such architecture of the signal processing unit allows for a reduced quantization step.

According to an embodiment with reference to the first aspect, the multiplier or the transmission module comprises a switch connected to the ADC to receive the digital signal. The switch is adapted to select the comparison phase or the selection phase among the two phases based on the result of the multiplier.

According to an embodiment with reference to the first aspect, the clock generator is connected to the phase selector to provide the m reference phases. Moreover, the phase selector is connected to the transmission module to provide the picked two phases, and the clock generator is coupled with the multiplier to provide the comparison phase.

Advantageously, the phase controller for distance measurement can thus be applied in the receive signal path.

According to an embodiment with reference to the first aspect, the clock generator is connected to the phase selector to provide the m reference phases. Moreover, the phase selector is connected to the multiplier to provide the picked two phases, and the clock generator is coupled with the transmission module to provide the selection phase.

Advantageously, the phase controller for distance measurement can thus be applied in the transmit signal path.

According to an embodiment with reference to the first aspect, the signal processing unit comprises four multipliers (a first, a second, a third and a fourth multiplier), an operational amplifier, a capacitor, a comparator, and a successive approximation register unit.

The multipliers each have one output and a first and a second input. The first input of the multipliers is connected to the detection module to receive the detector signal and the second input of the multipliers is connected to the oscillation module to receive the respective comparison phase.

The operational amplifier has one output and a first and a second input. The first input of the operational amplifier is connected to the output of the first and the second multiplier. The second input of the operational amplifier is connected to the output of the third and the fourth multiplier to receive the respective result of the multiplier.

The capacitor has two terminals connected between the first and the second input of the operational amplifier.

The comparator has one output and one input. The input of the comparator is connected to the output of the operational amplifier.

The successive approximation register unit has one output and one input. The output of the successive approximation register unit is connected to the oscillation module and the input of the successive approximation register unit is connected to the output of the comparator.

Herein, the oscillation module is adapted to provide two phases as respective comparison phase. A first phase of the two phases provided by the oscillation module is applied to the second input of the first multiplier and the fourth multiplier and a second phase of the two phases provided by the oscillation module is applied to the second input of the second multiplier and the third multiplier.

Furthermore, the processing module is adapted to calculate the approximate phase difference between the set of generated light impulses and the set of received reflections based on the signal output of the successive approximation register unit.

Advantageously, such architecture of the signal processing unit allows for a reduced quantization phase step or a coarse ToF distance measurement.

According to an embodiment with reference to the first aspect, the signal processing unit comprises a replicate driver adapted to generate a replicate signal based on the selection phase. The replicate driver is connected to the oscillation module to receive the selection phase and to the transmission module to provide the replicate signal.

Herein, the processing module is adapted to calculate, as approximate phase offset, an approximate phase difference between the generated replicate signal and the processed replicate signal based on the digital signal. The processing module is further adapted to calculate the approximate phase difference between the set of generated light impulses and the set of received reflections based on the phase offset.

According to a second aspect of the present invention, a method for time of flight measurement is specified.

The further above described signal processing units are particularly suitable for performing the methods described in the following. Features explained in association with the methods can therefore also be used for the signal processing units, and vice versa.

According to an embodiment with reference to the second aspect, the method includes generating, by an oscillation module, m reference phases. Then, a phase is selected among the m reference phases as a selection phase and a respective set of light impulses are generated, by a transmission module, based on the selection phase. A respective set of reflections of the set of light impulses are received, and a detector signal based on the set of reflections is generated by a detection module. The detector signal is multiplied by a respective comparison phase, by the multiplier. The result of the multiplier into a digital signal is converted by an ADC. The respective comparison phase or the respective selection phase is determined, by a processing module, based on the digital signal. Then, an approximate phase difference is calculated, by the processing module, between the set of generated light impulses and the set of received reflections based on the digital signal.

According to another embodiment with reference to the second aspect, the selection phase or the comparison phase is the first of the m reference phases.

According to another embodiment with reference to the second aspect, in the method includes additional steps. A phase selector picks two phases out of the m reference phases based on a control signal. A switch selects the comparison phase or the selection phase among the two phases based on the result of the multiplier.

According to another embodiment with reference to the second aspect the method includes additional steps. A replicate driver generates a replicate signal based on the selection phase. The processing module calculates, as approximate phase difference, an approximate phase difference between the generated replicate signal and the processed replicate signal based on the digital signal. The processing module calculates the approximate phase difference between the set of generated light impulses and the set of received reflections based on the approximate phase offset.

BRIEF DESCRIPTION OF THE DRAWINGS

Further advantages, advantageous embodiments and developments will become apparent from the exemplary embodiments described below in association with the figures.

In the figures.

Elements that are identical, of identical type of act identically are provided with the same reference signs in the figures. The figures and the size relationships of the elements illustrated in the figures among one another should not be regarded as to scale. Rather, individual elements may be illustrated with exaggerated size in order to enable better illustration or in order to afford a better understanding.

DETAILED DESCRIPTION OF ILLUSTRATIVE EMBODIMENTS

There are many methods to measure distance such as triangulation, interferometry, direct impulse type ToF, indirect phase type frequency modulation ToF, and confocal chromatic. The working principle selected is usually based on an applicable target distance range and a required measurement accuracy. Due to its ease of integrating in silicon and its cost effectiveness, the indirect phase ToF measurement principle is getting more attention recently, as described in R. Lange et al. "*Time-of-flight range imaging with a custom solid-state image sensor*", Laser Metrology and Inspection, Proc. SPIE. Vol. 3823, Munich, (1999), the content of which is being incorporated herein by reference in its entirety. An implementation of the working principle may be found, e.g., in ISL29501 at https://www.intersil.com/en/products/optoelectronics/proximity-sensors/light-to-digital-sensors/ISL29501.html.

Figure 1:
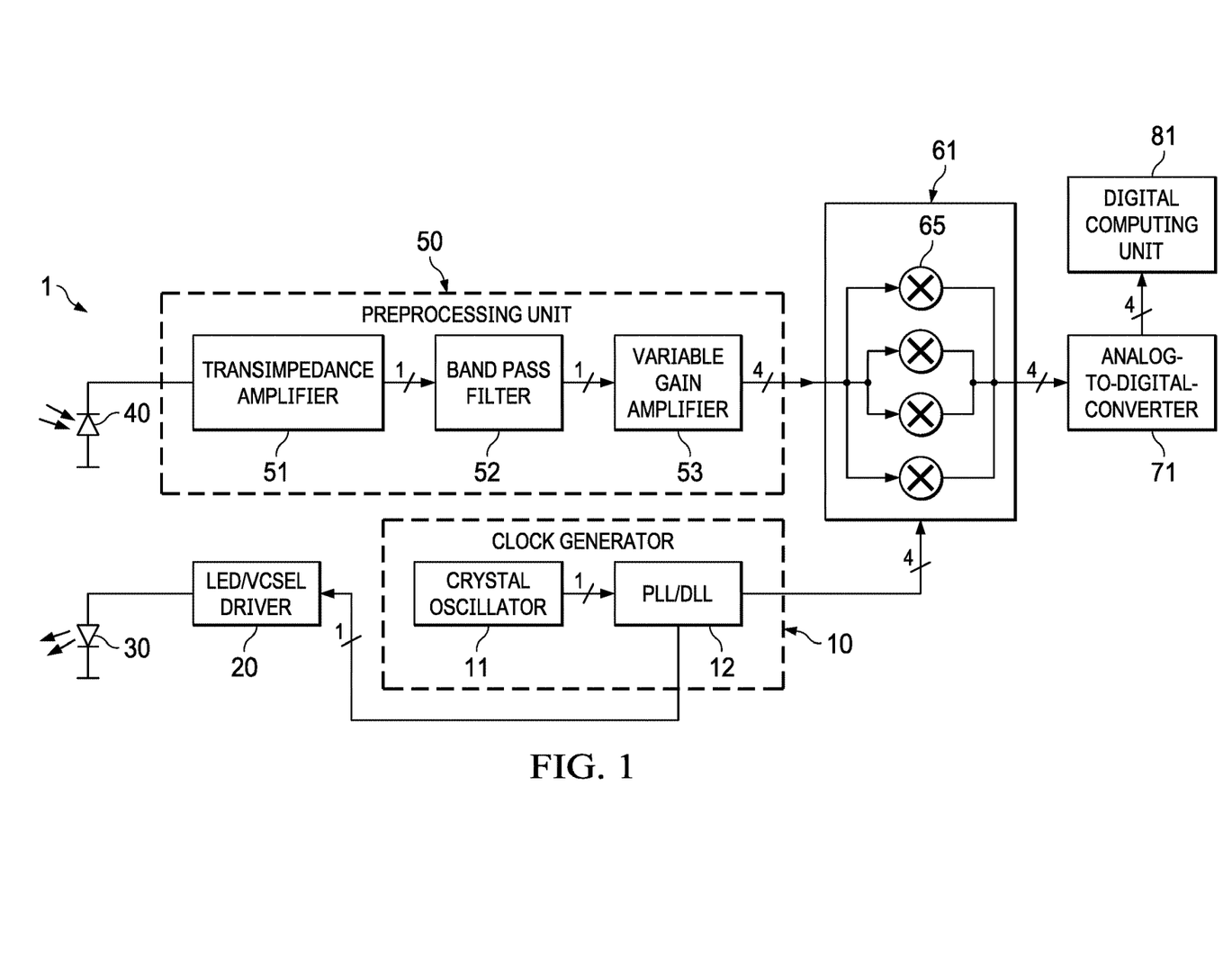
FIG. 1 shows a schematic circuit of an exemplary signal processing unit for time of flight measurement.

FIG. 1 shows a schematic circuit of an exemplary signal processing unit for time of flight measurement. The signal processing unit 1 may be implemented as an integrated circuit, comprising a clock generator 10 including an oscillator 11 such as an internal RC relaxation oscillator or a crystal oscillator and a Phase Locked Loop (PLL) or Delay (Line) Locked Loop (DLL) 12 for providing four reference phases at a desired modulation frequency. The signal processing unit 1 further comprises a light source 30 such as a LED or VCSEL along with a LED/VCSEL driver 20, together forming a transmission module. On the receiving side of the signal processing unit 1, a photo diode 40 for converting received light/photons to electrical current and a preprocessing unit 50 including a transimpedance amplifier 51, a band pass filter 52 and a variable gain amplifier 53 are arranged, together forming a detection module. Herein, the transimpedance amplifier 51 may be used to amplify and convert current to voltage; the band pass filter 52 may be used to pass a modulation frequency signal whereas out of band noise is rejected, thereby lowering the required dynamic range for the following entities; and the variable gain amplifier 53 may be used to assure that the signal is amplified adequately for subsequent signal processing entities such as an analog-to-digital-converter (ADC). The signal processing unit 1 further comprises a multiplier unit 61 including four multipliers 65, an ADC unit 71, including four ADC channels and a digital computing unit 81. Herein, each multiplier 65 of the multiplier unit 61 may be particularly adapted to multiply two analog sinusoidal signals of the same frequency. Furthermore, each ADC channel of the ADC unit 71 may be configured to convert a DC voltage (i.e., phase information) to a digital word for further filtering and computing in the digital domain.

The signal processing unit 1 is adapted to first illuminate a target object using the light source 30. A modulation frequency signal to drive the light source 30 may be a square wave of 5-10 MHz derived from the PLL/DLL 12. The PLL/DLL 12 is also generating four different clock phases (also referred to as reference phases) for demodulating a reflection of the illumination (in the following referred to as reflected signal) via the four multipliers 65 of the multiplier unit 61. The oscillator 11 may generate a low jitter clock input to the PLL/DLL 12.

The reflected signal may then be detected by the photodiode 4o and its current be converted and amplified by the transimpedance amplifier 51. Prior to demodulating the amplified signal by the multiplier 65 unit 61, the amplified signal gets filtered by the band pass filter 52 and appropriately gained up by the variable gain amplifier 53 to match to the full scale reference voltage of the ADC 71.

The output of the variable gain amplifier 53 is duplicated and input to the multiplier unit 61 such that each of the four multipliers 65 is input with the output of the variable gain amplifier 53. Each input of the multiplier unit 61 is hence separately demodulated by one of the four different clock phases. The four outputs of the multiplier unit 61 are then sampled and digitally converted by four separate ADC channels of the ADC 71. An anti-aliasing filter may be arranged in front of the ADC 71 as well as a digital low pass filter after the ADC 71 (not shown).

The phase can be computed in the digital domain using a digital computing unit 81. The phase may be determined from the four digitally converted products $a_0 \ldots a_3$ as $$\text{phase} = \tan^{-1}\left\{\frac{a_0 - a_1}{a_2 - a_3}\right\},$$

for instance by applying the COordinate Rotation DIgital Computer (CORDIC) algorithm. Subsequently, the distance D may also be computed in the digital domain as $$D = \frac{c \cdot \text{phase}}{4\pi f},$$

where c denotes the speed of light and f denotes the modulation frequency.

In the following, an improved architecture and method is specified to realize distance measurement based on the indirect phase ToF principle, which results in smaller die size, reduced cost and higher performance in terms of power and distance measurement accuracy with respect to the signal processing unit 1 illustrated in FIG. 1.

Figure 2:
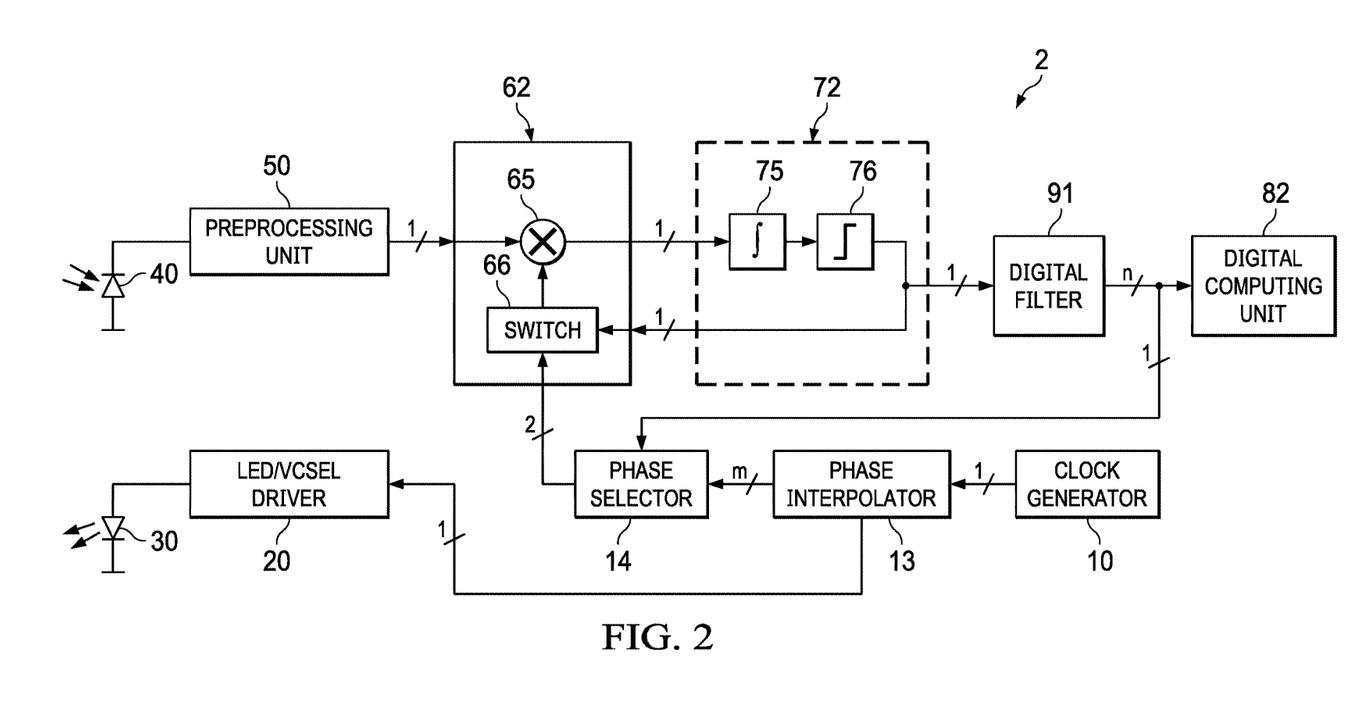
FIG. 2 shows a schematic circuit of a first exemplary embodiment of a signal processing unit according to the present invention.

FIG. 2 shows a schematic circuit of a first exemplary embodiment of a signal processing unit 2 according to the present invention.

Similar to FIG. 1, the signal processing unit 2 as illustrated in FIG. 2 comprises a clock generator 10, a transmission module 20, 30 and a detection module 40, 50. However, contrary to the circuit of FIG. 1 where the signal processing of the reflected signal in both analog and digital domain is achieved in a feed forward way, in the circuit of FIG. 2, the feedback is applied through an output of an ADC 82 to a switch 66 of a multiplier unit 62 for input phase selection.

In this case, an incremental ADC 72 is shown as an example. The ADC 72 comprises an integrator 75 and a comparator 76 (also referred to as quantizer). The ADC 72 may specifically be configured as a delta-sigma converter. Particularly, the ADC 72 comprises solely one ADC channel. Similarly, the multiplier unit 62 solely comprises one multiplier 65.

The idea is to find out what clock phase is in quadrature with the reflected signal at the input of the multiplier 62. In the following, $\Phi_{k-1}$ denotes a zero degree reference phase at the start of the illumination, $\Phi_k$ denotes a 90 degree delay (quadrature) from $\Phi_{k-1}$, and $\Phi_{k+1}$ denotes a 90 degree delay from $\Phi_k$.

The signal processing unit 2 further comprises a phase interpolator 13 and a phase selector 14 forming an oscillation module together with the clock generator 10. The oscillation module is particularly adapted to generate m reference phases, where m is a natural non-zero number, e.g., 100, 1000, 10000 or greater. Herein, the phase selector 14 is adapted to pick two phases $\Phi_1$ and $\Phi_2$ out of the m reference phases. The two phases $\Phi_1$ and $\Phi_2$ are then input to the switch 66. The switch 66 is adapted to select either of the two phases $\Phi_1$ and $\Phi_2$ based on the fed back output of the ADC 72. The phase selected by the switch to be multiplied by the reflected signal may also be referred to as comparison phase.

When the reflected signal is multiplied with its quadrature signal, the average output of the ADC 72 is zero or minimum. So, the average output of the ADC 72 will approach zero as it is driving the switch's 66 selection between $\Phi_k$ and $\Phi_{k+1}$. In other words, the quadrature clock is realized by interpolating between clock $\Phi_k$ and $\Phi_{k+1}$. By interpolating between the $\Phi_k$ and $\Phi_{k+1}$, the average phase that is in quadrature with the reflected signal can be found. The difference between this average phase and $\Phi_k$ is precisely the target distance, assuming there is no other processing delay, e.g., when a delay of the transmission module 20, 30 and of the detection module 40, 50 up to the input of the multiplier 65 is calibrated out.

The precision of the measurement may be subject to many factors, but with respect to the circuit of FIG. 2, the phase step difference between $\Phi_k$ and $\Phi_{k+1}$ and the number of oversampling in the ADC 72 are the main factors. A digital filter 91 can be used to estimate the average quadrature position and to reduce the phase step. As illustrated in FIG. 2, the hardware complexity is drastically reduced compared to FIG. 1. There is no need to provide hardware adapted to implement the CORDIC algorithm or similar computer computations. Furthermore, four instances of multipliers 65 and ADC channels are reduced to one each. Consequently, signal processing unit 2 allows for reduced power consumption and die sizes, accordingly.

Figure 3:
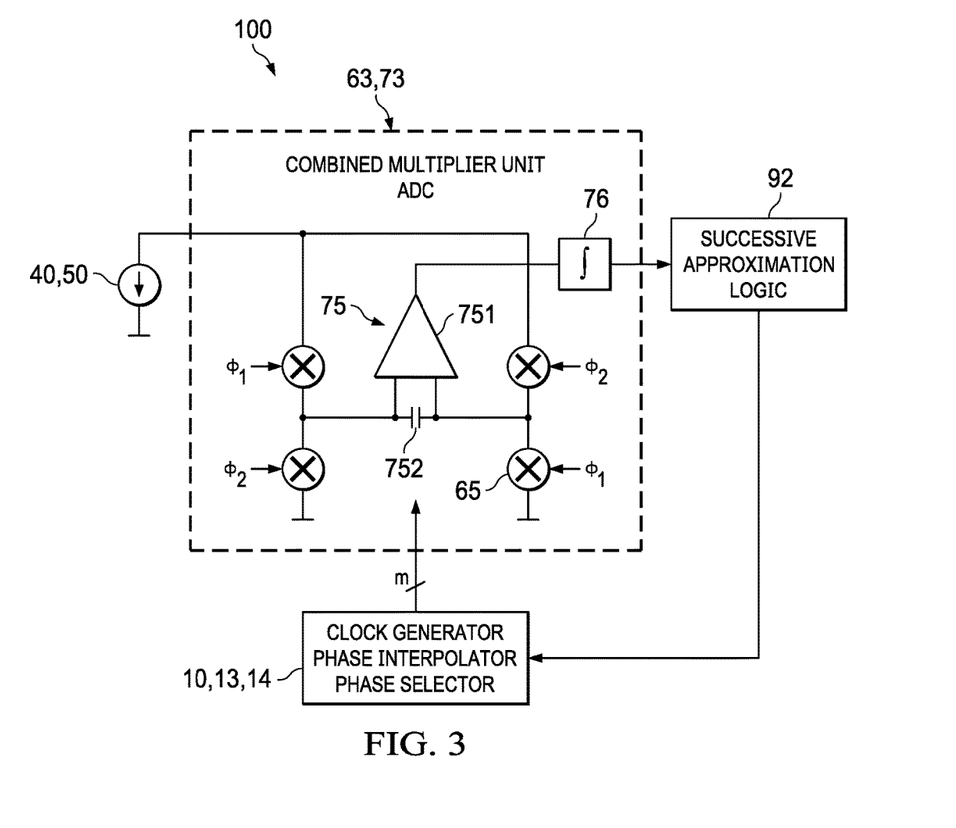
FIG. 3 shows a schematic circuit of an exemplary embodiment of an estimator unit of the signal processing unit illustrated in FIG. 2.

FIG. 3 shows a schematic circuit of an exemplary embodiment of an estimator unit 100 of the signal processing unit illustrated in FIG. 2. Instead of or additionally to the multiplier unit 62 and the ADC 72, the estimator unit 100 may be arranged between the detection module 40, 50 and the oscillation module to, 13, 14 in the circuit of FIG. 2. The estimator unit 100 comprises a combined multiplier unit 63 with four multipliers 65 and an ADC 73 comprising an operational amplifier 751 and a capacitor 752, together forming an integrator 75 and a comparator 76. Particularly, the estimator unit 100 allows for an alternative way to pre-estimate the phase delay from the return signal quickly and thus reducing the phase step in the circuit of FIG. 2. Here, the integrator 75 will keep accumulating the voltage representing the phase of the reflected signal with respect to $\Phi_1$ and $\Phi_2$. A successive approximation logic 92 will force to choose the appropriate set of $\Phi_1$, and $\Phi_2$ so that the average input to the comparator 76 is zero. In this regard, the successive approximation logic 92 may be adapted to provide a control signal to the phase selector 14 in order to allow for picking the appropriate two phases.

Figure 4:
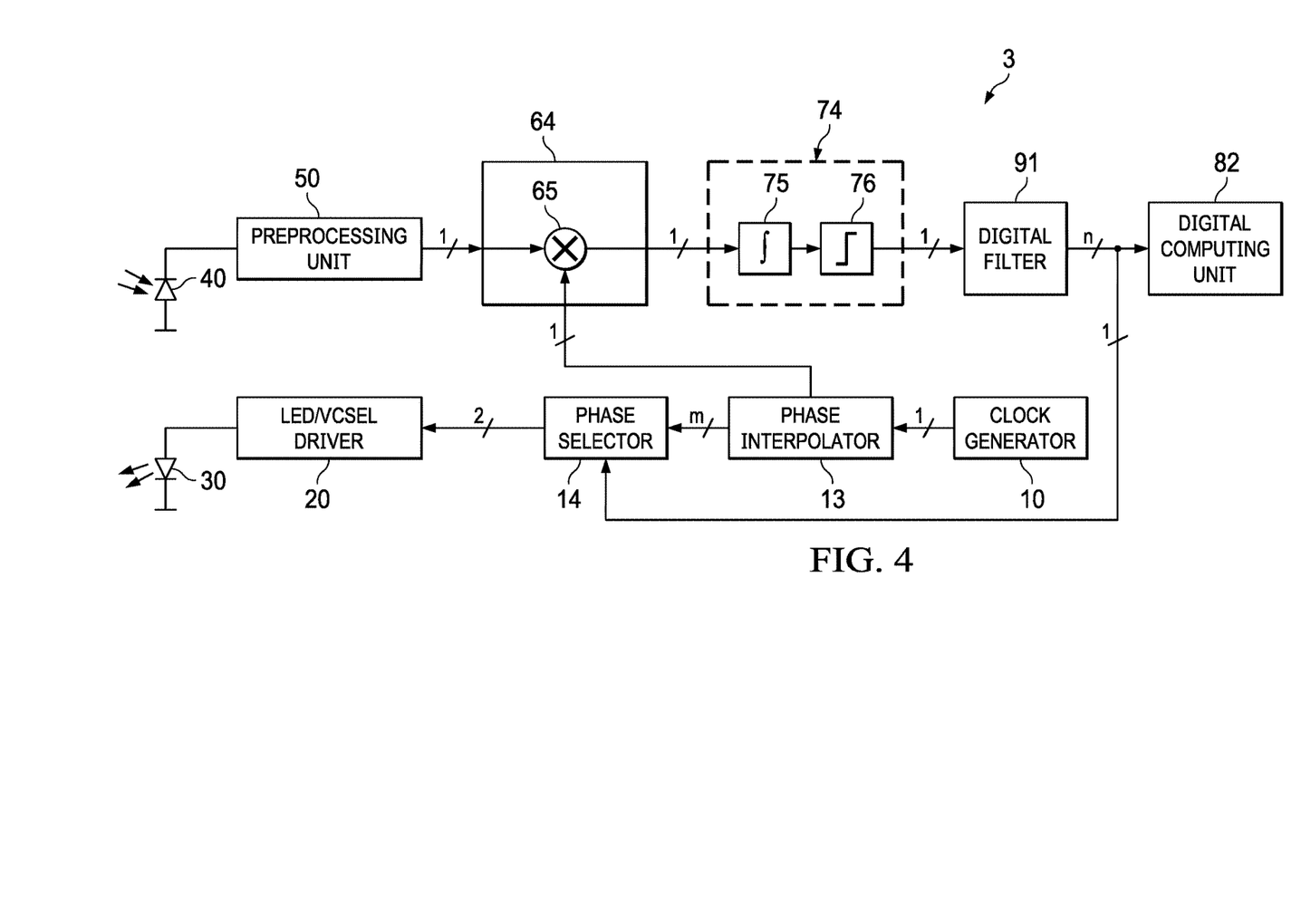
FIG. 4 shows a schematic circuit of a second exemplary embodiment of a signal processing unit according to the present invention.

FIG. 4 shows a schematic circuit of a second exemplary embodiment of a signal processing unit 3 according to the present invention. The circuit shown represents an alternative way of implementation with respect to the circuit of FIG. 2. Fundamentally, the driver signal of the light source 3o and hence the reflected signal is phase modulated instead of the clocks to the multiplier 65. For a fixed clock phase input to the multiplier 65, the reflected signal at the input of the multiplier 65 will be phase modulated such that its average phase will be in quadrature with the fixed clock phase. The signal sensing and processing is the same as in the circuit of FIG. 2, except the actual phase modulation is implemented on the light source 30 driver path.

Figure 5:
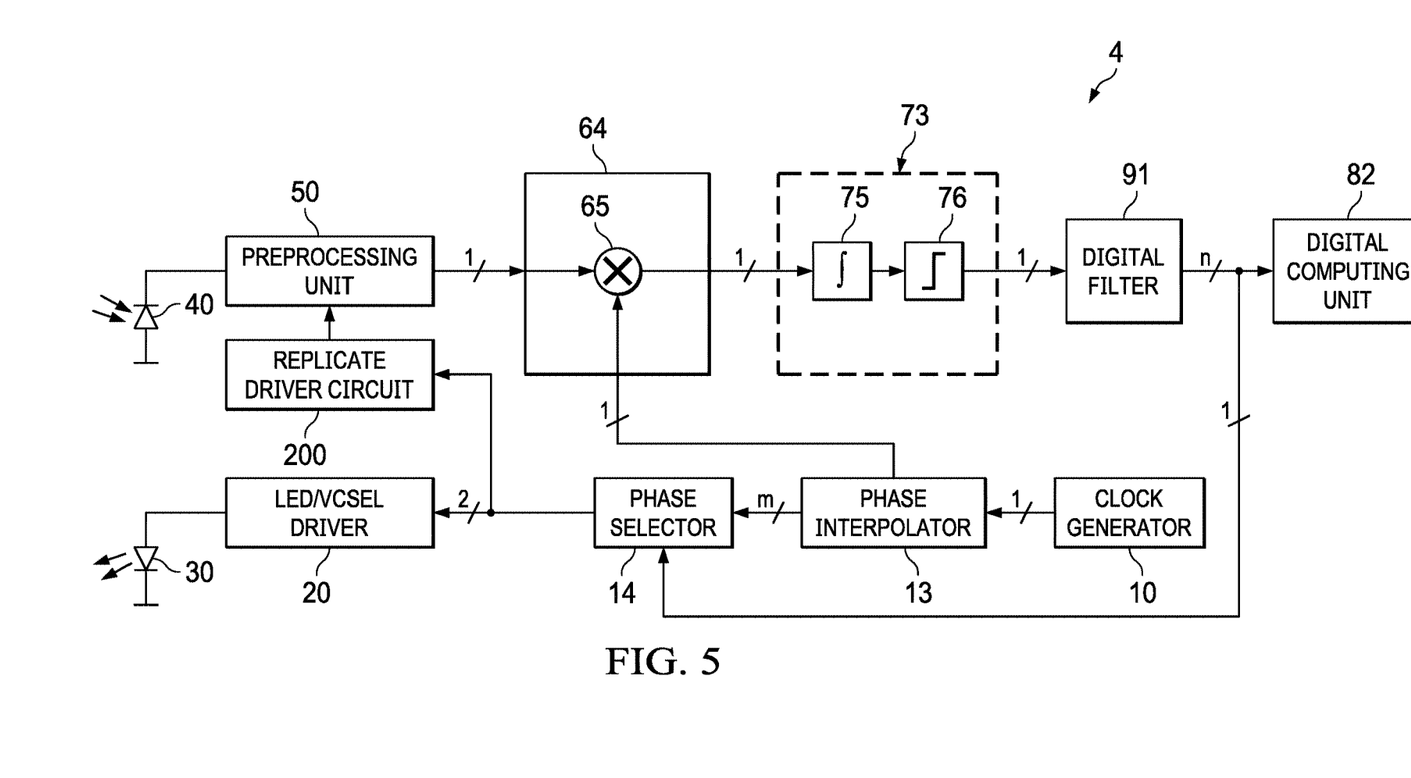
FIG. 5 shows a schematic circuit of a third exemplary embodiment of a signal processing unit according to the present invention.

FIG. 5 shows a schematic circuit of a third exemplary embodiment of a signal processing unit 4 according to the present invention. The circuit of FIG. 5 substantially corresponds to the circuit of FIG. 4, except for an additional replicate driver circuit 200 arranged between the phase selector 14 and the detection module 50. Such replicate driver circuit 200 may also be implemented in the circuits of FIG. 1 or 2.

Figure 6:
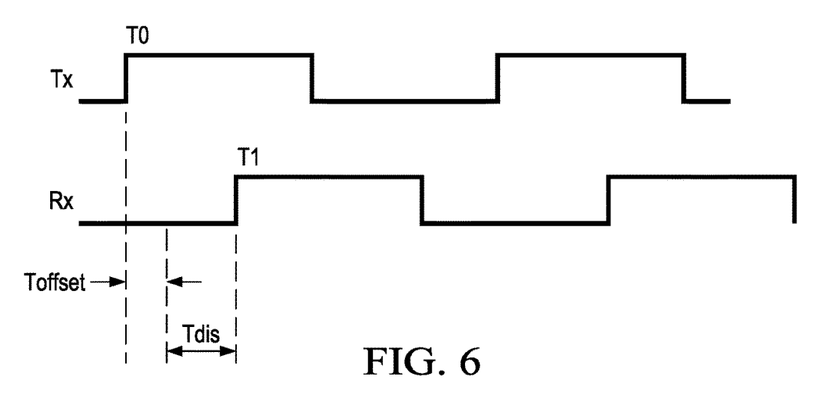
FIG. 6 shows an exemplary phase difference between light impulses generated and reflections received by the signal processing unit illustrated in FIG. 4 or 5.

For the ToF accurate distance measurement system, the distance offset and more critical, its drift may influence the result (See, e.g., FIG. 6). The exemplary circuit of FIG. 5 illustrates a way to deal with and calibrate out the offset and offset drift by inserting a replicate driver circuit 200 in the receive signal path. The replicate driver circuit 200 is adapted to mirror the driver delay and is subject to the same feedback control loop 50, 64, 73, 91, 14 as the real driver circuit 20 as described in FIG. 4. Since the signal processing unit 4 is completely controlling when illumination for the ToF distance measurement will occur, a back ground or fore ground calibration cycle can be inserted to measure the circuits' phase offset and its drift. The measured phase offset may be stored and subtracted from the normal distance phase measurement results. Thus, the distance offset and its drift due to the signal processing circuits' can be completely eliminated. In this regard, the signal processing unit 4 may be configured to run a calibration cycle after each 100, 1000 or more normal distance phase measurements and/or after every 1, 10 or more μs.

FIG. 6 shows an exemplary phase difference between light impulses generated and reflections received by the signal processing unit illustrated in FIG. 4 or 5.

At reference time To, the (fixed) internal clock signal of the phase interpolator 13 arrives at the input of the multiplier 65. This is also aligned with the signal driving the light source 30 for emitting the illumination signal Tx. It's defined in consideration for calibrating out the unwanted delays.

At arrival time $T_1$ of the reflected signal Rx at the input of the multiplier 65, the total time delay $\Delta T = T_0 - T_1$ between the illumination signal Tx and the reflected signal Rx equals $\Delta T_{driver} + \Delta T_{LED} + \Delta T_{dis} + \Delta T_{PD} + \Delta T_{Rx}$, with $\Delta T_{driver}$ the time delay due to driver circuits (e.g., LED/VCSEL driver 20), $\Delta T_{LED}$ the time delay due to LED/VCSEL electrical to optical conversion (e.g., light source 30), $\Delta T_{dis}$ the time delay due to target distance, $\Delta T_{PD}$ the time delay due to photo diode light to electrical current conversion (e.g., photo diode 40), $\Delta T_{Rx}$ the time delay due to receive circuits up to input of the multiplier 65 (e.g., preprocessing module 5o).

The measured distance is proportional to $\Delta T_{dis}$. The distance offset is proportional to $\Delta T_{offset} = \Delta T_{driver} + \Delta T_{LED} + \Delta T_{PD} + \Delta T_{Rx}$. The offset drift is proportional to $$\frac{\partial \Delta T_{offset}(x)}{\partial x},$$

where x can be temperature, ambient light or supply voltage.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

What is claimed is:

1. A signal processing unit comprising:
an oscillation module adapted to provide m reference phases, where m is an integer greater than 1;
a transmission module adapted to generate a set of light impulses based on a selection phase selected from the m reference phases;
a detection module adapted to receive a set of reflections of the set of light impulses and to generate a detector signal based on the set of reflections;
a multiplier adapted to obtain a result of multiplying the detector signal by a comparison phase;
an analog-to-digital-converter adapted to convert the result of the multiplier into a digital signal; and
a processing module adapted to determine the comparison phase or the selection phase and to calculate an approximate phase difference between the set of generated light impulses and the set of received reflections based on the digital signal,
wherein the processing module is connected to the oscillation module to provide a control signal for selecting the comparison phase or the selection phase.

2. The signal processing unit according to claim 1, wherein the analog-to-digital-converter comprises a delta-sigma converter.

3. The signal processing unit according to claim 1,
wherein the oscillation module is coupled with the transmission module to provide the selection phase,
wherein the oscillation module is coupled with the multiplier to provide the comparison phase,
wherein the detection module is connected to the multiplier to provide the detector signal,
wherein the multiplier is connected to the analog-to-digital-converter to provide the result to be converted, and
wherein the analog-to-digital-converter is connected to the processing module to provide the digital signal.

4. The signal processing unit according to claim 1, wherein the oscillation module comprises a clock generator adapted to generate the m reference phases and a phase selector adapted to pick, as two picked phases, two reference phases out of the m reference phases, wherein the processing module is adapted to control the phase selector based on the digital signal, and wherein the comparison phase or the selection phase is selected among the two picked phases based on the result of the multiplier.

5. The signal processing unit according to claim 4, wherein the multiplier or the transmission module comprises a switch connected to the analog-to-digital-converter to receive the digital signal, wherein the switch is adapted to select the comparison phase or the selection phase among the two phases based on the result of the multiplier.

6. The signal processing unit according to claim 4,
wherein the clock generator is connected to the phase selector to provide the m reference phases,
wherein the phase selector is connected to the transmission module to provide the two picked phases, and
wherein the clock generator is coupled with the multiplier to provide the comparison phase.

7. The signal processing unit according to claim 4,
wherein the clock generator is connected to the phase selector to provide the m reference phases,
wherein the phase selector is connected to the multiplier to provide the two picked phases, and
wherein the clock generator is coupled with the transmission module to provide the selection phase.

8. The signal processing unit according to claim 1, further comprising:
a plurality of multipliers, wherein the plurality of multipliers comprises a first multiplier, a second multiplier, a third multiplier, and a fourth multiplier, each multiplier having an output, and a first input and a second input, the first input being connected to the detection module to receive the detector signal and the second input being connected to the oscillation module to receive the comparison phase;
an operational amplifier with an output, and a first and a second input, the first input being connected to the output of the first multiplier and the second multiplier and the second input being connected to the output of the third multiplier and the fourth multiplier to receive the result of the multiplier;
a capacitor with two terminals connecting the capacitor between the first input and the second input of the operational amplifier;
a comparator with an output and an input, the input being connected to the output of the operational amplifier; and
a successive approximation register unit with an output connected to the oscillation module and an input connected to the output of the comparator,
wherein the oscillation module is adapted to provide two phases as the comparison phase, a first phase thereof being applied to the second input of the first multiplier and the fourth multiplier, and a second phase thereof being applied to the second input of the second multiplier and the third multiplier, and
wherein the processing module is adapted to calculate the approximate phase difference between the set of generated light impulses and the set of received reflections based on the output of the successive approximation register unit.

9. The signal processing unit according to claim 1, further comprising:
a replicate driver adapted to generate a replicate signal based on the selection phase, the replicate driver being connected to the oscillation module to receive the selection phase and connected to the transmission module to provide the replicate signal,
wherein the processing module is adapted to calculate, as approximate phase offset, an approximate phase difference between the generated replicate signal and the replicate signal based on the digital signal, and
wherein the processing module is further adapted to calculate the approximate phase difference between the set of generated light impulses and the set of received reflections based on the approximate phase offset.

10. A method comprising:
generating, by an oscillation module, m reference phases, where m is an integer greater than 1;
selecting a phase among the m reference phases as a selection phase;
generating a set of light impulses based on the selection phase;
receiving a set of reflections of the set of light impulses; and
generating a detector signal based on the set of reflections;
multiplying the detector signal by a comparison phase to obtain a result;
converting the result of the multiplier into a digital signal;

determining, by a processing module, the comparison phase or the selection phase based on the digital signal; and calculating an approximate phase difference between the set of generated light impulses and the set of received reflections based on the digital signal, wherein the processing module is connected to the oscillation module to provide a control signal for selecting the comparison phase or the selection phase.

11. The method according to claim 10, wherein the selection phase or the comparison phase is a first reference phase in the m reference phases.

12. The method according to claim 10, further comprising:

picking, by a phase selector, two phases out of the m reference phases based on a control signal; and selecting, by a switch, the comparison phase or the selection phase among the two phases based on the result of the multiplier.

13. The method according to claim 10, further comprising:

generating, by a replicate driver, a replicate signal based on the selection phase;

calculating, by the processing module, as approximate phase difference, an approximate phase difference between the generated replicate signal and the replicate signal based on the digital signal; and calculating, by the processing module, the approximate phase difference between the set of generated light impulses and the set of received reflections based on the approximate phase difference.

14. The method according to claim 10, wherein selecting the phase among the m reference phases comprises selecting, by the processing module, at least one phase among the m reference phases, wherein generating the set of light impulses based on the selection phase comprises generating, by a transmission module, a respective set of light impulses based on the selection phase, wherein multiplying the detector signal by the comparison phase to obtain the result comprises multiplying, by at least one multiplier, the detector signal by a respective comparison phase provided by the processing module, and wherein, by the processing module, determining the comparison phase or the selection phase based on the digital signal comprises determining, by the processing module, the respective comparison phase or the respective selection phase based on the digital signal.

\* \* \* \* \*